(12) United States Patent
Albert et al.

(10) Patent No.: US 10,188,005 B2
(45) Date of Patent: Jan. 22, 2019

(54) CONTROL UNIT DEVICE FOR A MOTOR VEHICLE AND METHOD FOR MANUFACTURING SUCH A DEVICE

(71) Applicant: CONTI TEMIC MICROELECTRONIC GMBH, Nuremberg (DE)

(72) Inventors: Andreas Albert, Hoechstadt/Aisch (DE); Gerhard Bauer, Graefenberg (DE); Juergen Henniger, Erlangen-Dechsendorf (DE); Matthias Keuten, Altdorf (DE); Michael Novak, Nuremberg (DE); Bernhard Schuch, Neusitz (DE); Matthias Wieczorek, Neunkirchen am Sand (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 0 days.

(21) Appl. No.: 15/508,598

(22) PCT Filed: Aug. 6, 2015

(86) PCT No.: PCT/EP2015/068210
§ 371 (c)(1),
(2) Date: Mar. 3, 2017

(87) PCT Pub. No.: WO2016/034362
PCT Pub. Date: Mar. 10, 2016

(65) Prior Publication Data
US 2017/0290178 A1 Oct. 5, 2017

(30) Foreign Application Priority Data
Sep. 3, 2014 (DE) .......................... 10 2014 217 552

(51) Int. Cl.
*H05K 5/00* (2006.01)

(52) U.S. Cl.
CPC .......... *H05K 5/0069* (2013.01); *H05K 5/0043* (2013.01); *H05K 5/0082* (2013.01); *H05K 5/0095* (2013.01)

(58) Field of Classification Search
CPC .. H05K 7/20454; H05K 3/284; H05K 5/0082; H05K 5/0095; H05K 5/0069; H05K 5/0043
See application file for complete search history.

(56) References Cited

U.S. PATENT DOCUMENTS 5,250,782 A   10/1993  Cordelle et al.
5,880,406 A *  3/1999  Gerstel ............... G01P 15/0802
                                                        174/256

(Continued)

FOREIGN PATENT DOCUMENTS

DE      69218074 T2     6/1997
DE   102006050351 A1 *  5/2008  .......... H05K 5/0082

(Continued)

OTHER PUBLICATIONS

English translation of DE102006050351 is provided with attachment of the foreign refernece.*

*Primary Examiner* — Dimary Lopez Cruz
*Assistant Examiner* — Abhishek Rathod
(74) *Attorney, Agent, or Firm* — Laurence A. Greenberg; Werner H. Stemer; Ralph E. Locher

(57) ABSTRACT

A control unit device for a motor vehicle includes a circuit board, on which a plurality of electronic components are disposed. The electronic components are electrically coupled to one another by conductor tracks on the circuit board. A substantially gas-impermeable cover is materially joined or bonded to the circuit board in such a way that the cover, together with the circuit board, forms a closed cavity in which the electronic components and the associated (Continued)

conductor tracks are located. A method for producing the control unit device is also provided.

13 Claims, 2 Drawing Sheets

(56) References Cited

U.S. PATENT DOCUMENTS

| | | | | |
|---|---|---|---|---|
| 6,094,349 | A * | 7/2000 | Fassel | H05K 3/284 165/80.2 |
| 6,313,729 | B1 * | 11/2001 | Winterer | G01L 19/003 257/417 |
| 6,341,063 | B2 * | 1/2002 | Kinoshita | H05K 5/0039 361/690 |
| 6,430,054 | B1 * | 8/2002 | Iwata | H05K 7/026 174/560 |
| 6,875,029 | B2 | 4/2005 | Kawabata et al. | |
| 7,813,134 | B2 * | 10/2010 | Katsuro | H05K 7/20454 165/104.33 |
| 8,505,891 | B2 * | 8/2013 | Guyenot | H05K 7/1417 206/219 |
| 8,727,794 | B2 * | 5/2014 | Tanaka | H05K 5/064 361/752 |
| 9,661,765 | B2 * | 5/2017 | Wakana | H05K 7/20854 |
| 2001/0015887 | A1 * | 8/2001 | Sanada | H05K 1/144 361/704 |
| 2006/0105220 | A1 * | 5/2006 | Shu | H01M 8/0232 429/518 |
| 2008/0310114 | A1 * | 12/2008 | Pawlenko | H05K 7/20454 361/704 |
| 2009/0032946 | A1 * | 2/2009 | Park | H01L 23/49816 257/738 |
| 2011/0096495 | A1 * | 4/2011 | Heise | H05K 1/0263 361/688 |
| 2013/0114221 | A1 | 5/2013 | Graf | |
| 2015/0022976 | A1 | 1/2015 | Ott | |
| 2015/0098193 | A1 | 4/2015 | Loibl et al. | |
| 2015/0208556 | A1 * | 7/2015 | Kodama | B60L 3/003 363/123 |
| 2015/0366086 | A1 * | 12/2015 | Kajiwara | H05K 7/20854 361/736 |

FOREIGN PATENT DOCUMENTS

| | | |
|---|---|---|
| DE | 102010026954 A1 | 1/2012 |
| DE | 102012213916 A1 | 5/2013 |
| DE | 102012204004 A1 | 9/2013 |
| JP | S4974289 U | 6/1974 |
| JP | S55880 U | 1/1980 |
| JP | S5526107 U | 2/1980 |
| JP | S61102080 U | 6/1986 |
| JP | S62112182 U | 7/1987 |
| JP | S63113321 U | 7/1988 |
| JP | H03151694 A | 6/1991 |
| JP | 2004079576 A | 3/2004 |
| JP | 2006319235 A | 11/2006 |
| JP | 2007216836 A | 8/2007 |
| WO | 2008049724 A1 | 5/2008 |

* cited by examiner

CONTROL UNIT DEVICE FOR A MOTOR VEHICLE AND METHOD FOR MANUFACTURING SUCH A DEVICE

BACKGROUND OF THE INVENTION

FIELD OF THE INVENTION

The invention relates to a control unit device for a motor vehicle. Furthermore, the invention relates to a method for manufacturing a control unit device.

In motor vehicles, control unit devices are used with, for example, an electronic control circuit and associated electronic components such as sensors for different tasks. For example, sensors are used in a transmission in order to determine rotational speeds of shafts and positions of gear actuators. The control unit devices contain, for example, a control logic, one or more microprocessors and further elements in order to evaluate measured values of the sensors and to activate gear actuators, in particular valves. The control unit devices are increasingly installed directly on the components of a vehicle which are to be controlled, in order, for example, to avoid or reduce cable harnesses. In particular, control unit devices for a transmission are arranged directly in the transmission or on the transmission. During operation, the control unit devices are subjected to adverse ambient conditions. There are typically high temperatures present of, for example, up to 150° and/or high pressures. In addition, the control unit devices are regularly subjected to hot and/or aggressive oils.

SUMMARY OF THE INVENTION

An object on which the invention is based is to describe a control unit device and a method for manufacturing such a device, which contributes to reliable operation of the control unit device.

According to one aspect of the invention, a control unit device for a motor vehicle, which has a circuit board, is described. A plurality of electronic components are arranged on the circuit board and are electrically coupled to one another via conductor tracks of the circuit board. In addition, the control unit device has an essentially gas-impermeable cover which is connected in a materially joined fashion to the circuit board in such a way that said cover forms with the circuit board a closed cavity in which the electronic components and the associated conductor tracks are located.

The electronic components comprise, for example, capacitors, coils, a microprocessor or the like which are arranged on the circuit board and have an electrical operative connection to one another. For example, the electronic components are electrically coupled to one another via conductor tracks of the circuit board and/or by means of bonded gold wires.

The cover, which is gas-impermeable and also fluid-impermeable, protects the electronic components of the control unit device against oils, in particular aggressive oils, and damaging gases and chemicals. Furthermore, the electronic components are protected against salts or processing residues. The oils, gases, salts and/or residues are present, for example, in a transmission on which or within which the control unit device is arranged. The corresponding conductor tracks are also protected by the cover. For this purpose, the cover is connected in a materially joined fashion to the circuit board in such a way that with the circuit board a closed cavity is formed around the electronic components. In other words, a closed, peripheral materially connected seam is formed around the electronic components and/or the further electronic components and the corresponding conductor tracks.

In contrast to covers which are connected in a positively locking fashion, essentially no fluids and/or gases can enter the cavity. Therefore the electronic components are sealed and sealed tightly with respect to the surroundings. In addition, it is possible to dispense with rubber-like seals which are used, in particular, with positively locking covers. The seals would not ensure any complete tightness with respect to gas since the gases can diffuse to a considerable degree through such seals.

For example, the chemical or gases comprise sulfur compounds, as a result of which sulfides can come about. Sulfides are at least partially electrically conductive and would become deposited on unprotected electronic components, the conductor tracks of the circuit board and/or the gold wires. This can lead to chemical reactions with the sulfides. For example, the conductor tracks of the circuit board, in particular silver conductor tracks, oxidize with the sulfur compounds. In this context, line resistances and/or functions of the electronic components can change and, for example, adversely influence the shifting behavior of a transmission. Furthermore, such gases can bring about changes in signals, with the result that, for example the control unit device makes incorrect evaluations.

Overall, the described cover which is connected in a materially joined fashion to the circuit board improves the service life and accuracy of the control unit device. In addition, the described control unit device can be implemented as a prefabricated module for an application in situ such as, for example, in the transmission or as an attachment device.

According to one refinement, the materially joined connection between the cover and the circuit board is produced by means of welding.

According to a further refinement, the materially joined connection between the cover and the circuit board is produced by means of soldering, wherein a metal layer of the circuit board is soldered to the cover by means of a solder. The metal layer is understood to be, for example, one or more conductor tracks of the circuit board which are soldered to the cover using the solder. The metal layer is, for example, a copper layer. The solder comprises metallic soldering materials such as, for example, tin.

According to a further refinement, the soldering comprises laser soldering. By means of laser soldering it is possible to introduce the heat necessary for soldering in a local and therefore punctiform fashion into the corresponding regions to be soldered. In contrast to soldering within soldering ovens or heating tunnels, the local introduction of heat avoids the entire control unit device being strongly heated. As a result of the heating of the entire control unit device, other components which are connected to the circuit board, such as, for example, capacitors, could become detached from the circuit board.

According to a further refinement, the metal layer is sealed in such a way that direct contact of the metal layer with the surroundings of the cover outside the cavity is prevented. The sealing prevents the abovementioned gases or oils from entering the cavity, and therefore coming into contact with the electronic components, as a result of chemical decomposition of the metal layer. For example, the gases can "eat" through the metal layer. This could additionally lead to a situation in which the cover is no longer sufficiently connected in a materially joined fashion to the circuit board and becomes detached from it. During the operation of a motor vehicle, the control unit device is subjected to high temperatures, as a result of which a rise in pressure occurs in the cavity. As a result, large forces act on the circuit board and on the cover, and the cover must withstand these forces. By means of the seal it is ensured that the cover does not become detached from the circuit board owing to the decomposition of the metal layer under the prevailing pressures and forces.

According to a further refinement, the metal layer is sealed at least in a region facing away from the cavity, with the result that contact of the metal layer with the surroundings of the cover outside the cavity is prevented.

For example, the metal layer is provided with an additional coating and subsequently soldered to the cover. Alternatively, a sealing coating is applied outside the cavity, which sealing coating overlaps with the circuit board and the cover in such a way that the metal layer is not exposed outside the cavity and is not in contact with the surroundings of the cover. The additional coating or the sealing coating ensures that the metal layer has no direct contact with the surroundings of the cover outside the cavity. This prevents the metal layer from being decomposed owing to the oils or gases, as a result of which the cover would become detached from the circuit board and/or the gases or fluids would penetrate the cavity.

According to a further refinement, the cover has a metal material or a plastic material. The metal material can be, for example, a solderable metal. The metal material permits a stable configuration of the cover and ensures a high level of impermeability with respect to fluids and gases. When a plastic material is used, a particularly lightweight and elastic cover can be made possible. As a result, for example the abovementioned rises in pressure within the cavity can be equalized by elastic resilience of the cover.

According to a further refinement, the cover is coated with a weldable or solderable material on a side facing the circuit board. For example, when a plastic material is used for the cover, said cover can have a solderable or weldable coating for the materially joined connection to the circuit board, permitting the materially joined connection to be produced.

According to a further refinement, the cover has a gas-impermeable coating. The gas-impermeable coating is applied, for example, on an outer side of the cover facing away from the cavity and promotes the situation in which essentially no gases and/or fluids can enter the closed cavity.

According to a further refinement, the circuit board is arranged on a metallic base carrier. As a result, the control unit device can be mechanically secured via the base carrier to a further element, for example a housing of a transmission. In addition, heat of the control unit device can easily be carried away via the metallic base carrier. As a result, overheating of the control unit device can be avoided.

According to a further refinement, the control unit device has a plug connector which is arranged on the circuit board or the metallic base carrier while being electrically coupled to said circuit board, wherein the cover is configured in such a way that in the state in which it is connected to the circuit board said cover secures the plug connector mechanically to the circuit board or the base carrier outside the cavity. The plug connector is electrically coupled to the circuit board, for example by means of press fit contacts. The cover has a corresponding shape so that it secures the plug connector to the circuit board in a frictionally locking, for example clamping, fashion, when the cover is connected in a materially joined fashion, to the circuit board, and therefore securely positioned. For example, the cover has a projection, wherein the plug connector is clamped between the projection and the circuit board or the base carrier. Additionally or alternatively, the cover is configured in such a way that it secures the plug connector to the circuit board or the base carrier by frictional locking.

According to a second aspect of the invention, a method for producing a control unit device according to the first aspect of the invention is described. The method comprises:
  making available the circuit board on which the electronic components are arranged;
  making available the gas-impermeable cover;
  connecting the cover to the circuit board in a materially joined fashion such that the cover forms, with the circuit board, a closed cavity in which the electronic components are located.

The method essentially makes possible the abovementioned advantages.

Further refinements and advantages are described in the dependent claims and the following detailed description of an exemplary embodiment.+

The exemplary embodiment of the invention will be described below in detail with reference to the figures.

In the figures:

DESCRIPTION OF THE INVENTION

Figure 1:
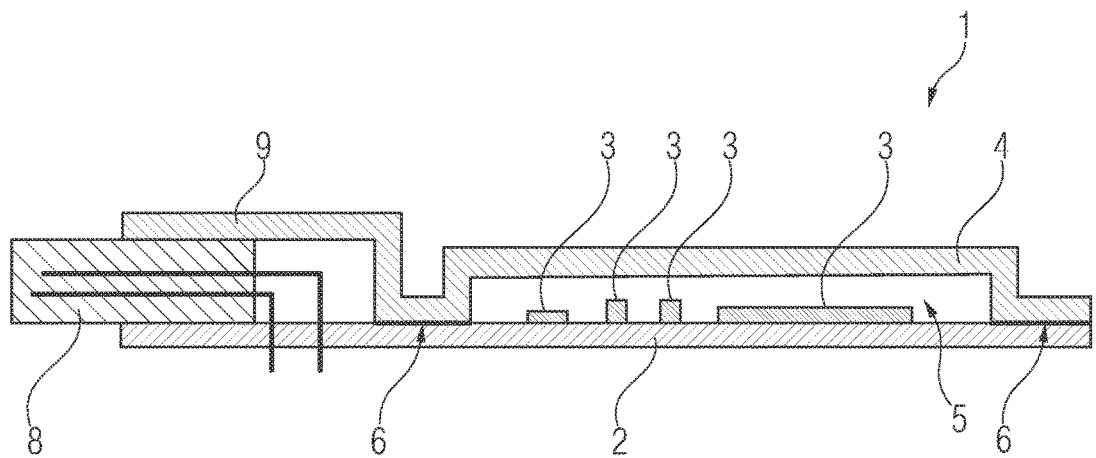
FIG. 1 shows a schematic sectional view of a control unit device according to a first exemplary embodiment.
Figure 2:
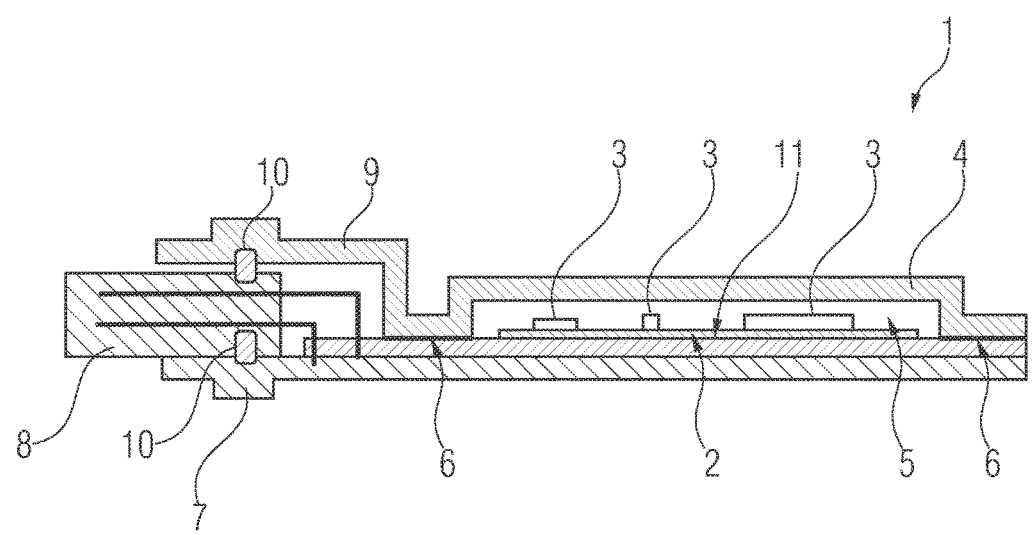
FIG. 2 shows a schematic sectional view of a control unit device according to a second exemplary embodiment.
Figure 3:
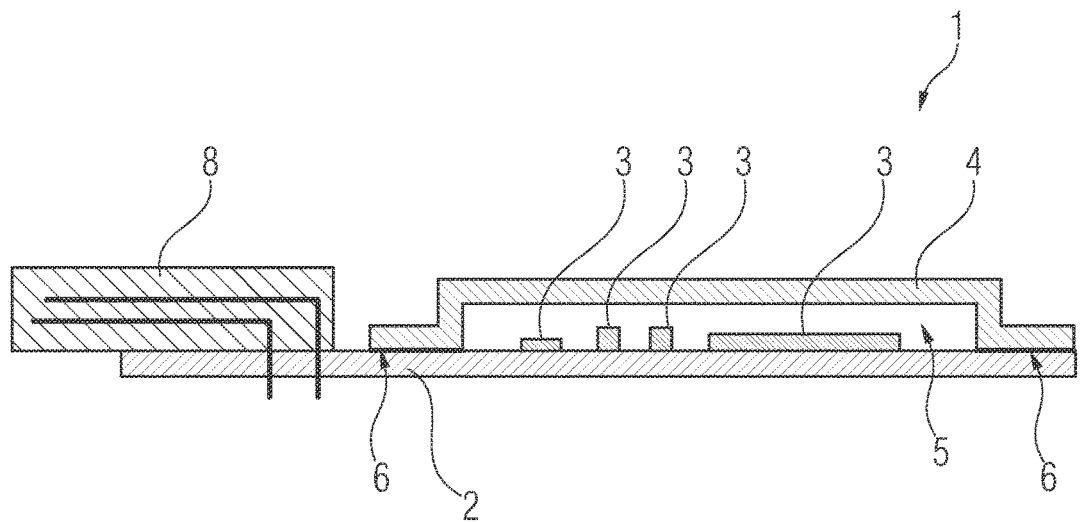
FIG. 3 shows a schematic sectional view of a control unit device according to a third exemplary embodiment.

FIGS. 1 to 3 show schematic sectional views of a control unit device 1 according to three exemplary embodiments. Firstly, common features of the three exemplary embodiments are described before details are given on the differences.

In the exemplary embodiments, the control unit device 1 is a control unit device of an automatic transmission of a motor vehicle. The control unit device 1 is configured to evaluate, for example, measured values of sensors such as Hall sensors, and to control a switching operation of the automatic transmission as a function of the measured values. Alternatively, the control unit device 1 can also be provided for other purposes of use.

Each control unit device 1 has a circuit board 2. A multiplicity of electronic components 3 are arranged on the circuit board 2. Said electronic components 3 comprise, for example, capacitors, coils, at least one microprocessor and/or other elements. The electronic components 3 are electrically coupled to one another, in particular via bonded gold wires and/or conductor tracks of the circuit board 2.

In order to protect the electronic components 3 and the corresponding conductor tracks, a gas-impermeable cover 4 is soldered to the circuit board 2. The cover 4 has a metal material which can be soldered. The cover 4 is therefore connected in a materially joined fashion to the circuit board 2, wherein said cover 4 bounds a closed cavity 5 with the circuit board 2. A coherent materially joined connecting seam is therefore formed around the electronic components 3, between the cover 4 and the circuit board 2. The cavity 5 is therefore completely sealed and sealed tightly with respect to the surroundings of the cover 4.

In order to produce the materially joined connection or the soldered connection, a metal layer 6 of the circuit board 2 is soldered to the cover 4. For this purpose, a solder such as tin is applied to the metal layer 6, which solder is melted in order to produce the connection. The metal layer 6 comprises one or more conductor tracks of the circuit board 2. In particular, the metal layer 6 is composed of a copper material. The solder is suitable for high-temperature applications, in particular for temperatures in the region of 200° Celsius.

The cover 4 is provided for protecting the electronic components 3 and associated conductor tracks of the circuit board 2 against oils, gases and the like as described at the beginning. In particular, the cover 4 prevents sulfur-like compounds from entering the cavity 5 and from being able to come into contact with the electronic components 3 and/or the conductor tracks. In this context, there is no need for positive locking of the cover 4 with the circuit board 2 and no need for seals, which would not ensure any complete impermeability to gas.

Instead of a metal material, the cover 4 can also have a plastic material. The plastic material is coated with a solderable material on a side facing the circuit board 2, with the result that said plastic material can be soldered to the circuit board 2. Likewise, the cover 4 can have a non-solderable metal material, for example, aluminum, which is then coated with the solderable material at corresponding locations.

The cover 4 can optionally also have a gas-impermeable additional coating which is preferably applied to an outer side of the cover 4 facing away from the cavity 5. This coating contributes to preventing the ingress of gases or fluids into the cavity 5. In particular, in the case of a plastic cover such an additional coating may be absolutely necessary.

In order to electrically couple to sensors, in order to control actuators and/or in order to connect electrically to further components such as, for example, a monitoring unit, the control unit device 1 has in each case a plug connector 8. The plug connector 8 is electrically coupled to the circuit board 2, for example by means of press fit contacts or via a soldered connection. The plug connector 8 is arranged outside the cavity 5.

In the text which follows, the differences of the three exemplary embodiments are explained according to the FIGS. 1 to 3.

In the exemplary embodiment according to FIG. 1, the plug connector 8 is arranged on the circuit board 2. In the state of the cover 4 in which it is soldered to the circuit board 2, said cover 4 is embodied in such a way that it secures the plug connector 8 in a frictionally locking fashion to the circuit board 2. For this purpose, the cover 4 has a projection 9. The plug connector 8 is clamped at least partially between the projection 9 and the circuit board 2. The control unit device 1 which is shown in FIG. 1 is provided to be mounted within a transmission.

In the exemplary embodiment according to FIG. 2, the circuit board 2 is secured to a metallic base carrier 7. Via the metallic base carrier 7, the circuit board 2 can be mechanically secured to the cover 4 at a further component, for example at a housing wall of a transmission. For example, the base carrier 7 is welded, screwed or mounted in some other way with the further component.

Furthermore, the plug connector 8 of the control unit device 1 is not arranged on the circuit board 2 itself or mechanically secured thereto, but instead to the base carrier 7. In this context, the plug connector 8 is secured in a frictionally locking fashion to the base carrier 7 via a projection 9 of the cover 4, analogously to the exemplary embodiment according to FIG. 1. In particular, the plug connector 8 is clamped tight. In addition, optional seals 10 are provided which seals tighten the electrical coupling of the plug connector 8 with respect to the circuit board 2.

Furthermore, the electronic components 3 are not arranged on the circuit board 2 but rather on an additional circuit board 11. The additional circuit board 11 is an HDI (High Density Interconnect) circuit board which is configured in a very compact fashion. The additional circuit board 11 is arranged on the circuit board 2. In this context, the additional circuit board 11 is laminated onto the circuit board 2. Other connection techniques are conceivable.

The control unit device 1 which is shown according to FIG. 2 is alternatively additionally encapsulated in a housing.

The plug connector 8 according to FIGS. 1 and 2 can optionally also be mechanically coupled in each case in a frictionally locking fashion to the cover 4. As a result, the plug connector 8 can be mechanically secured to the circuit board 2, or to the base carrier 7, in an improved way.

Optionally, the plug connector 8 according to FIGS. 1 and 2 can also be part of the cover 4. Therefore, the plug connector 8 and the cover 4 are embodied in one piece. This provides a saving in terms of manufacturing costs and mounting costs.

In an exemplary embodiment (not shown), instead of the plug connector 8 shown in FIGS. 1 and 2 a different plastic attachment component is provided which is secured to the circuit board 2 and/or the metallic base carrier 7 by means of the cover 4.

In the exemplary embodiment according to FIG. 3, the plug connector 8 is not secured mechanically to the circuit board 2 by means of the cover 4. Instead, the plug connector 8 is itself mechanically secured to the circuit board 2, for example soldered thereto, or by means of press fit contact formation. Other connection techniques are also conceivable, for example welding. Alternatively, the circuit board 2 shown in FIG. 3 can, in a way analogous to the exemplary embodiment according to FIG. 2, be applied to a metallic base carrier. In this context, the plug connector 8 can be secured to the base carrier instead of being secured to the circuit board 2. The control unit device 1 shown in FIG. 3 is in turn provided to be mounted within a transmission.

Figure 4:
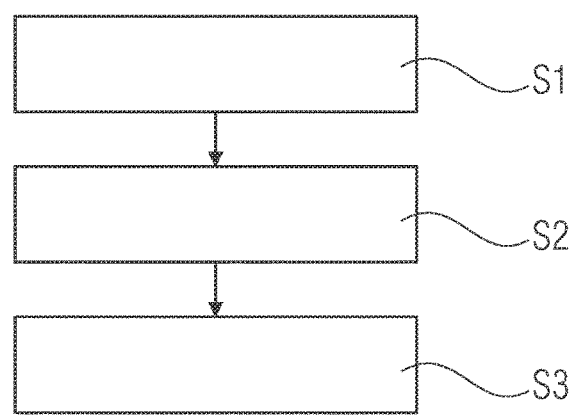
FIG. 4 shows a schematic flowchart of a method for producing a control unit device according to one of the exemplary embodiments.

FIG. 4 is a schematic view of a flowchart of a method for producing the control unit devices 1 described on the basis of FIGS. 1 to 3. In particular, the connection of the cover 4 to the respective control unit device 1 of the three exemplary embodiments is described.

In a step S1, the circuit board 2 on which the electronic components 3 are arranged is made available.

Furthermore, the gas-impermeable cover 4 is made available in a step S2.

In a step S3, the cover 4 is soldered to a metal layer 6 of the circuit board 2, with the result that the closed cavity 5, in which the electronic components 3 are located, is formed.

In step S3, the cover 4 which is made available and the circuit board 2 which is made available are correspondingly arranged in a soldering oven or conducted through a hot air tunnel. In this context, heat is introduced into this control unit device 1, in particular into the solder, with the result that the latter is melted in order to produce the materially joined connection between the cover 4 and the circuit board 2.

Alternatively, instead of the soldering in the soldering oven or in the hot air tunnel, laser soldering can also be provided. In this context, thermal energy is introduced by means of a laser in a punctiform fashion into the regions of the control unit device 1 which are to be soldered. The thermal energy is therefore essentially not introduced into other regions of the control unit device 1, for example into the electronic components 3.

The metal layer 6 can optionally be sealed before the materially joined connecting process, with the result that direct contact of the metal layer 6 with the surroundings of the cover 4 outside the cavity 5 is prevented. For this purpose, the metal layer 6 is provided, for example, with an additional coating and subsequently soldered to the cover 4. The additional coating ensures that the metal layer 6 does not have any direct contact with the surroundings of the cover 4 outside the cavity 5. This prevents the metal layer 6 from being decomposed owing to the oils or gases, as a result of which the cover 4 would become detached from the circuit board 2 and/or the gases or fluids would penetrate the cavity 5.

The sealing process will optionally take place after step S3, that is to say after the connecting process, wherein a sealing coating is applied outside the cavity 5, which sealing coating overlaps with the circuit board 2 and the cover 4. In this context, the sealing coating overlaps with the above-mentioned components in such a way that the metal layer 6 outside the cavity 5 is not exposed and does not have any contact with the surroundings of the cover 4.

The invention claimed is:

1. A control unit device for a motor vehicle, the control unit device comprising:
    a circuit board having conductor tracks;
    a plurality of electronic components disposed on said circuit board, said electronic components being electrically coupled to one another by said conductor tracks of said circuit board;
    a substantially gas impermeable cover connected to said circuit board in a materially joined manner, causing said cover and said circuit board to form a closed cavity containing said electronic components and said conductor tracks associated with said electronic components;
    a plug connector disposed on said circuit board and electrically coupled to said circuit board, said cover mechanically securing said plug connector to said circuit board outside said closed cavity by connecting said cover to said circuit board; and
    wherein said circuit board includes a metal layer, and said materially joined connection between said cover and said circuit board is a soldered connection between said metal layer and said cover.

2. The control unit device according to claim 1, wherein said materially joined connection between said cover and said circuit board is a welded connection.

3. The control unit device according to claim 1, wherein said soldered connection is a laser soldered connection.

4. The control unit device according to claim 1, wherein said cover includes a metal material or a plastic material.

5. The control unit device according to claim 4, wherein said cover has a side facing said circuit board, and a solderable material coats said side of said cover facing said circuit board for producing said materially joined connection.

6. The control unit device according to claim 4, which further comprises a gas impermeable coating on said cover.

7. The control unit device according to claim 1, which further comprises a metallic base carrier on which said circuit board is disposed.

8. The control unit device according to claim 7, which further comprises:
    a plug connector disposed on said base carrier and electrically coupled to said circuit board;
    said cover mechanically securing said plug connector to said base carrier outside said closed cavity by connecting said cover to said circuit board.

9. A method for manufacturing a control unit device, the method comprising the following steps:
    providing a circuit board having conductor tracks;
    placing electronic components on the circuit board and electrically coupling the electronic components to one another through the conductor tracks of the circuit board;
    providing a gas impermeable cover;
    connecting the cover to the circuit board in a materially joined manner, causing the cover and the circuit board to form a closed cavity containing the electronic components and the conductor tracks associated with the electronic components;
    providing a plug connector on the circuit board and electrically coupled to the circuit board, the cover mechanically securing the plug connector to the circuit board outside the closed cavity by connecting the cover to the circuit board; and
    providing the circuit board with a metal layer; and carrying out the connecting step by soldering or laser soldering the metal layer of the circuit board to the cover.

10. The method according to claim 9, which further comprises welding the cover to the circuit board.

11. The method according to claim 9, which further comprises: providing the cover with surroundings outside the cavity; and
    sealing the metal layer before the connecting step to prevent direct contact of the metal layer with the surroundings of the cover outside the cavity.

12. The method according to claim 9, which further comprises, after the connecting step, applying a sealing coating, being disposed outside the cavity and overlapping the circuit board and the cover, to seal the metal layer.

13. A control unit device for a motor vehicle, the control unit device comprising:
    a circuit board having conductor tracks;
    a plurality of electronic components disposed on said circuit board, said electronic components being electrically coupled to one another by said conductor tracks of said circuit board;
    a substantially gas impermeable cover connected to said circuit board in a materially joined manner, causing said cover and said circuit board to form a closed cavity containing said electronic components and said conductor tracks associated with said electronic components;
    a metallic base carrier on which said circuit board is disposed;
    a plug connector disposed on said base carrier and electrically coupled to said circuit board, said cover mechanically securing said plug connector to said base carrier outside said closed cavity by connecting said cover to said circuit board; and
    wherein said circuit board includes a metal layer, and said materially joined connection between said cover and said circuit board is a soldered connection between said metal layer and said cover.

* * * * *